United States Patent
Kuker et al.

(10) Patent No.: US 11,921,927 B1
(45) Date of Patent: Mar. 5, 2024

(54) DYNAMIC AND CONTEXT AWARE CABIN TOUCH-SCREEN CONTROL MODULE

(71) Applicant: Rockwell Collins, Inc., Cedar Rapids, IA (US)

(72) Inventors: Anthony D. Kuker, Cedar Rapids, IA (US); Christopher M. Avgenackis, North Liberty, IA (US); Stephanie L. Cooper, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 2 days.

(21) Appl. No.: 17/965,465

(22) Filed: Oct. 13, 2022

Related U.S. Application Data (60) Provisional application No. 63/255,515, filed on Oct. 14, 2021, provisional application No. 63/255,552, (Continued)

(51) Int. Cl.
*G06F 3/048* (2013.01)
*B64D 11/00* (2006.01)
(Continued)

(52) U.S. Cl.
CPC ........ *G06F 3/016* (2013.01); *B64D 11/00155* (2014.12); *G06F 3/0484* (2013.01); *G06F 3/0488* (2013.01)

(58) Field of Classification Search
CPC .. G06F 3/016; G06F 3/0484; B64D 11/00155
See application file for complete search history.

(56) References Cited

U.S. PATENT DOCUMENTS

| | | |
|---|---|---|
| 5,617,331 A | 4/1997 | Wakai et al. |
| 7,028,304 B1 | 4/2006 | Weinberger et al. |

(Continued)

FOREIGN PATENT DOCUMENTS

| | | |
|---|---|---|
| AU | 2002357727 A1 | 6/2003 |
| AU | 2014274529 B2 | 7/2018 |

(Continued)

OTHER PUBLICATIONS

Tan et al., Application of Automation for Low Cost Aircraft Cabin Simulator, 2010, IEEE, 4 pages.*

*Primary Examiner* — Linh K Pham
(74) *Attorney, Agent, or Firm* — Suiter Swantz pc llo (57) ABSTRACT

A cabin control apparatus for installation in a cabin surface of an aircraft or other vehicle includes a set of haptic display devices in a housing, each haptic display device having a compact touch-sensitive display surface via which a passenger or user may provide control input for cabin services (e.g., lighting, seat adjustment, crew call, in-flight entertainment (IFE)). Each haptic display device includes haptic actuators for simulating the movement and feel of a mechanical button or switch. Each haptic display device provides information to the user as to the currently controlled cabin service or system, and the set of devices may be toggled between different operating modes wherein the set of devices controls a different set of services. Cabin services and systems controlled by the cabin control module may include passenger-specific context as well as network context, e.g., based on the time of day or the position of the vehicle.

13 Claims, 6 Drawing Sheets

Related U.S. Application Data filed on Oct. 14, 2021, provisional application No. 63/255,476, filed on Oct. 14, 2021.

(51) Int. Cl.
*G06F 3/01* (2006.01)
*G06F 3/0484* (2022.01)
*G06F 3/0488* (2022.01)

(56) References Cited

U.S. PATENT DOCUMENTS

| | | | |
|---|---|---|---|
| 7,343,157 | B1 | 3/2008 | Mitchell |
| 7,970,019 | B2 | 6/2011 | Shay et al. |
| 8,436,825 | B2 | 5/2013 | Coni et al. |
| 8,489,276 | B2 | 7/2013 | Callahan et al. |
| 8,610,549 | B2 | 12/2013 | Modarres et al. |
| 9,317,146 | B1 * | 4/2016 | Hufnagel ............... G06F 3/016 |
| 9,654,103 | B2 | 5/2017 | Buttolo et al. |
| 9,690,380 | B2 * | 6/2017 | Monkhouse ........... G06F 3/016 |
| 9,742,898 | B2 | 8/2017 | Hockenberry et al. |
| 10,068,728 | B2 | 9/2018 | Huska et al. |
| 10,168,782 | B1 * | 1/2019 | Tchon .................... G06F 3/016 |
| 10,423,228 | B2 * | 9/2019 | Cherif ................... G06F 3/0446 |
| 10,562,542 | B1 * | 2/2020 | Shannon ................ B60K 35/00 |
| 11,281,295 | B2 | 3/2022 | Yee et al. |
| 11,365,007 | B2 | 6/2022 | Wu |
| 11,455,039 | B2 * | 9/2022 | Heyd ..................... G09B 9/165 |
| 2003/0184574 | A1 | 10/2003 | Phillips et al. |
| 2003/0208764 | A1 | 11/2003 | Galipeau et al. |
| 2003/0233658 | A1 * | 12/2003 | Keen ...................... H04N 7/106 |
| | | | 348/E7.071 |
| 2006/0142002 | A1 | 6/2006 | Funderburk et al. |
| 2006/0209037 | A1 | 9/2006 | Wang et al. |
| 2012/0206248 | A1 | 8/2012 | Biggs |
| 2013/0207793 | A1 | 8/2013 | Weaber et al. |
| 2014/0132528 | A1 | 5/2014 | Catton |
| 2016/0195931 | A1 | 7/2016 | Czelnik et al. |
| 2017/0270113 | A1 * | 9/2017 | Ebeling ................ G06F 16/93 |
| 2018/0004294 | A1 | 1/2018 | Eraslan et al. |
| 2018/0074591 | A1 | 3/2018 | Modarres et al. |
| 2018/0281990 | A1 | 10/2018 | Fagan et al. |
| 2019/0138153 | A1 * | 5/2019 | Olley .................... G06F 3/0445 |
| 2019/0346926 | A1 * | 11/2019 | Kirisken ................ G06F 3/016 |
| 2020/0070982 | A1 * | 3/2020 | Mayne .................. B60N 3/002 |
| 2020/0192532 | A1 * | 6/2020 | Van Wiemeersch ... B60K 37/02 |
| 2021/0129672 | A1 * | 5/2021 | Ahn ...................... B60K 37/06 |
| 2021/0362874 | A1 | 11/2021 | Gunaratnage et al. |
| 2021/0376883 | A1 * | 12/2021 | Harper ............. B64D 11/00155 |
| 2022/0001985 | A1 | 1/2022 | Bathla et al. |
| 2022/0055751 | A1 * | 2/2022 | Hansson ............. B64D 11/0646 |
| 2022/0083139 | A1 | 3/2022 | Heyd et al. |
| 2023/0034020 | A1 * | 2/2023 | Yalla ............... B64D 11/00155 |

FOREIGN PATENT DOCUMENTS

| | | |
|---|---|---|
| EP | 2817684 A4 | 11/2015 |
| EP | 2421755 B1 | 10/2018 |
| EP | 3230829 B1 | 10/2019 |
| EP | 3296205 B1 | 3/2022 |
| GB | 2583946 A | 11/2020 |
| WO | 2022165595 A1 | 8/2022 |

* cited by examiner

DYNAMIC AND CONTEXT AWARE CABIN TOUCH-SCREEN CONTROL MODULE

CROSS-REFERENCE TO RELATED APPLICATIONS

The present application claims the benefit under 35 U.S.C. § 119(e) of U.S. Provisional Application Ser. No. 63/255,476, filed Oct. 14, 2021, U.S. Provisional Application Ser. No. 63/255,552, filed Oct. 14, 2021, and U.S. Provisional Application Ser. No. 63/255,515, filed Oct. 14, 2021, which are each incorporated herein by reference in the entirety.

BACKGROUND

Conventional passenger cabin controls in business jet environments are static, discrete mechanical buttons restricted to a single function. Accordingly, if a cabin control system is enhanced or expanded to provide additional functionality, additional buttons will be needed for each new function (e.g., volume control for an inflight entertainment system (IFE)), whether or not the passenger is actually using an audio source. Additional buttons add weight and bulk, and may be difficult or impossible to incorporate in some configurations, e.g., into an armrest.

SUMMARY

In an aspect, a cabin control module for a passenger cabin in an aircraft or other vehicle is disclosed. In embodiments, the module includes a housing mountable in a cabin surface and a set of haptic display devices within the housing. Each haptic display device is connected to one or more cabin systems or functions controllable by a user via the haptic display device. Each haptic display device has a touchscreen for receiving control input by the user (e.g., by pushing or otherwise engaging with the touchscreen), the touchscreen capable of displaying a status or an identifier of the cabin system currently controlled by that haptic display device. An actuation layer simulates the movement or feeling of a mechanical button when the user engages with the touchscreen.

In some embodiments, the set of touchscreens may include multiple operating modes, each mode capable of controlling a different cabin function or set thereof based on context or user selection of a particular operating mode.

In some embodiments, the set of touchscreens includes a touchscreen dedicated to allowing the user to toggle through different operating modes.

In some embodiments, the controlled cabin systems include in-flight entertainment (IFE) systems; reading and cabin lights; and call buttons for alerting members of the cabin crew.

In some embodiments, the cabin control module includes an audio jack, HDMI port, USB-C port, or other like physical connector port via which the user may connect a remote user device.

In some embodiments, the user may provide control input to an IFE system by connecting the remote user device to the audio jack.

In some embodiments, when the audio jack is engaged by a remote user device, the remaining haptic display devices may provide for user control of IFE audio volume, channel selection, and/or other related IFE controls.

In some embodiments, the user may remotely control other cabin systems and functions via the remote user device when connected to a physical port.

In some embodiments, the user may charge the remote user device from an aircraft power supply when connected to a physical port.

In some embodiments, the cabin control module is dedicated to a passenger seat, and the cabin control module is configured to display operating context specific to the occupying passenger.

In some embodiments, the operating context displayed by the cabin control module is based on information provided by an avionics network aboard the aircraft, e.g., the current time of day, current flight segment, or aircraft position.

In some embodiments, cabin system/function identifiers displayed by the display touchscreens may include graphical elements (e.g., logos or icons), photographic images, or textual content.

In some embodiments, each haptic display device includes haptic actuators, e.g., linear resonant actuators, eccentric rotating mass actuators, piezoelectric actuators.

In some embodiments, the haptic actuators provide haptic feedback when a user engages with a display touchscreen by actuating a portion of the touchscreen to simulate the feel or movement of a mechanical button or switch.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a set of dynamic touchscreen devices configured for context-aware interaction and control with a cabin environment by passengers aboard an aircraft or other vehicle. The set of devices may be scaled up or down in size (e.g., in terms of the number of devices, whereas the set is always compact) and may be inserted into a bulkhead or other cabin service for plug-and-play operation. The cabin control devices are modular in that different types of devices are not needed for different types of cabin systems; rather, the set of devices may be programmed for control of seat configurations, cabin lighting, crew call, in-flight entertainment (IFE) systems, etc. Devices may be further personalized, and may interact with avionics networks to provide both flight path-specific and passenger-specific control functions.

Figure 1:
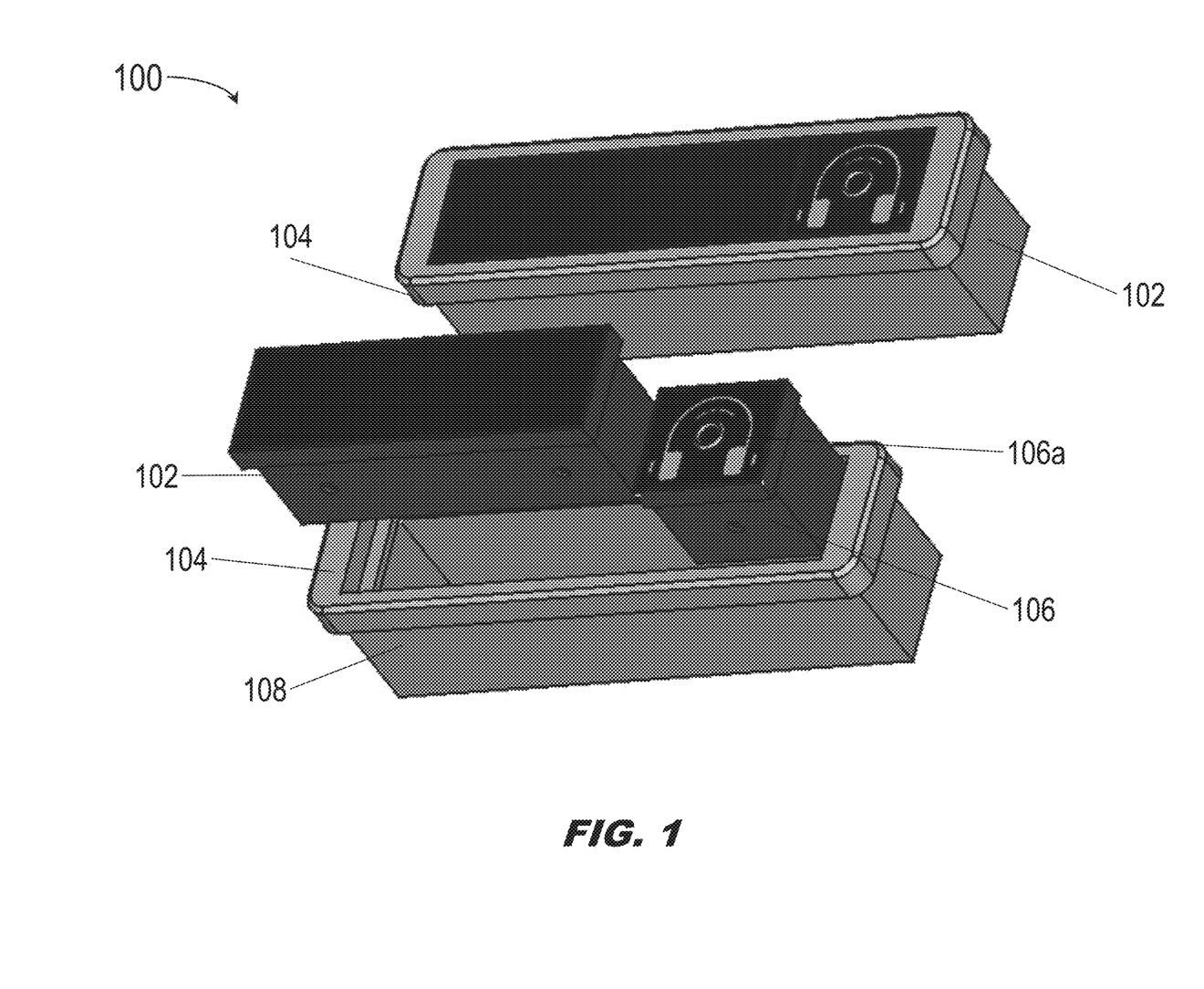
FIG. 1 is an illustration of a cabin control module according to example embodiments of this disclosure.

Referring to FIG. 1, a context-aware cabin control module 100 is shown. The cabin control module 100 may include a haptic display device 102 and bezel 104. In embodiments, the cabin control module 100 may be inserted into an armrest, wall, or other surface conveniently located for a passenger, such that the bezel 104 remains above the surface within which the cabin control module is embedded. In some embodiments, the cabin control module 100 may be partially or fully concealed under a removable cover.

In embodiments, the haptic display device 102 may incorporate one or more digital displays (e.g., organic light emitting diode (OLED) based displays, miniature touchscreen surfaces), each touchscreen surface configured for multiple context-dependent display and/or operating functions. For example, the cabin control module 100 may include the haptic display device 102 and an auxiliary jack module 106 (e.g., dynamic digital headphone jack) including a headphone jack 106a configured for accepting a plug or other like headphone or auxiliary connector, such that a passenger connecting to the headphone jack may use headphones, earphones, auxiliary speakers, or other like devices for audio playback. In embodiments, the cabin control module 100 may be co-located with the auxiliary jack module 106 within a housing 108 and bezel 104.

A dynamic digital headphone jack is generally discussed in U.S. patent application Ser. No. 17/965,402, entitled "DYNAMIC CABIN DIGITAL HEADPHONE JACK," filed on Oct. 13, 2022, which is incorporated herein by reference in the entirety.

It is noted that the haptic display device 102 and/or one or more components of the cabin control module 100 (e.g., haptic display devices as described below, auxiliary jack module 106, or the like) may be configured to be retrofitted with existing components in an aircraft cabin. For example, the haptic display device 102 and/or one or more components of the cabin control module 100 may be dimensioned to couple to an existing component within the aircraft cabin. For instance, the haptic display device 102, auxiliary jack module 106, and/or other components of the cabin control module 100 may be dimensioned to couple to an existing opening in an armrest of an aircraft seat or an existing opening elsewhere within the aircraft cabin. Further, the haptic display device 102 may be configured in a horizontal or a vertical configuration as described in greater detail below.

Figure 2A:
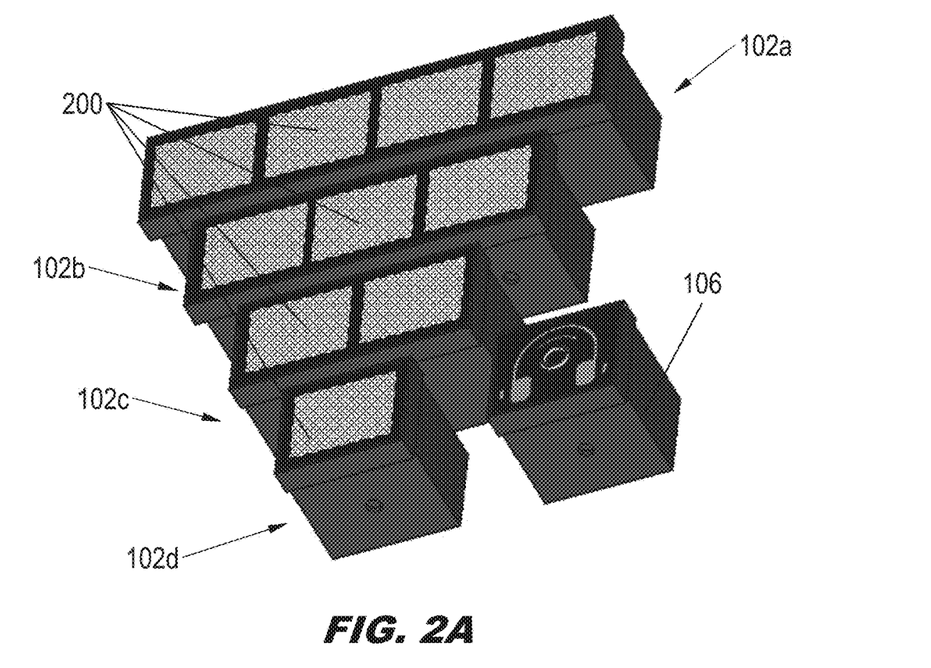
FIG. 2A is an illustration of various configurations of the haptic display devices of the cabin control module of FIG. 1.

Referring also to FIG. 2A, the haptic display devices 102a-102d are shown.

In embodiments the haptic display devices 102a-102d may be implemented similarly to the haptic display device 102 of FIG. 1, in a variety of sizes. For example, the haptic display device 102a may be of a unit size corresponding to a single cabin control button and comprising a single miniature touchscreen surface 200 configured for various display and/or system control functions as needed. Similarly, in embodiments the haptic display devices 102b-102d may be of integer multiples of the unit size, e.g., corresponding to two, three, four, or more touchscreen surfaces 200, each touchscreen surface configured to dynamically update based on current operating context or operating modes and configured for independent control of an aspect of a cabin service or system. For example, as disclosed in greater detail below, any of the haptic display devices 102a-102d may be configured in a particular operating mode relating to a particular cabin system or service, e.g., seat reconfiguration, lighting control, in-flight entertainment (IFE), while each individual miniature touchscreen surface 200 may be configured to control a specific aspect within the current operating mode, e.g., a first touchscreen surface may transition a passenger seat from an upright to a reclined configuration, a second touchscreen surface may transition the passenger seat to a fully berthed configuration, and a third touchscreen may return the passenger seat to the upright configuration.

For example, the haptic display devices 102a-102d may be combined with an auxiliary jack module 106, e.g., within a housing (108, FIG. 1) and bezel (104, FIG. 1) of appropriate size.

Figure 2B:
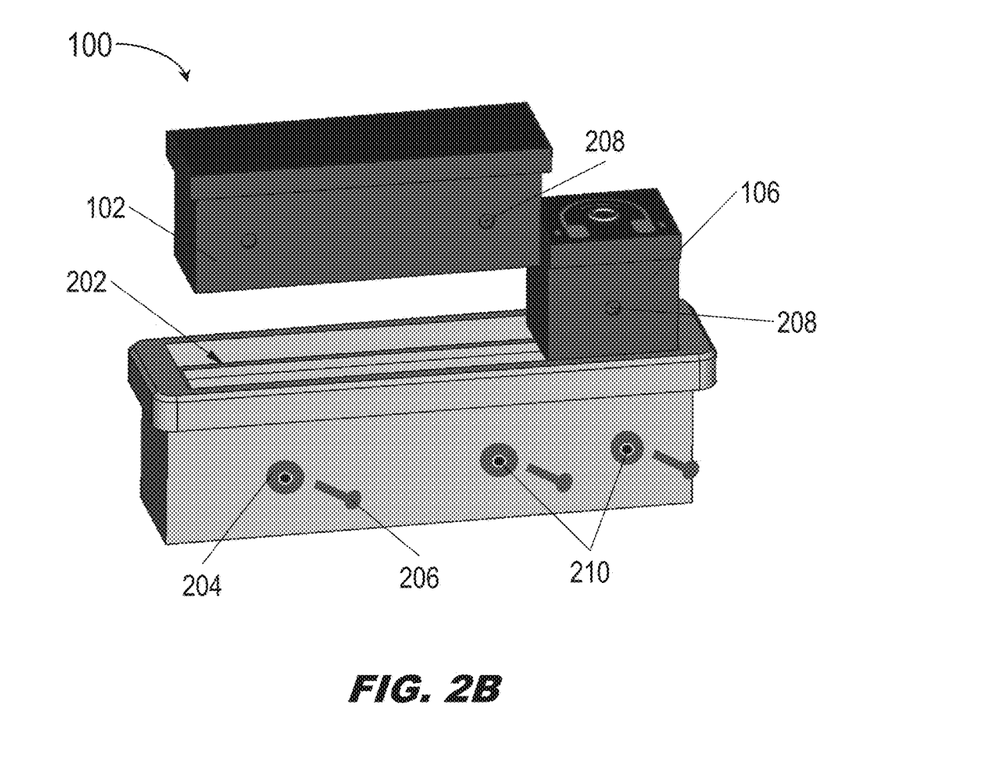
FIG. 2B is an illustration of a mounting assembly for the haptic display devices of the cabin control module of FIG. 1.

Referring also to FIG. 2B, in embodiments the haptic display device 102 and/or auxiliary jack module 106 may be mountable within a cavity 202 of the housing 108 via a mounting assembly. For example, the mounting assembly may include one or more flexible mounting members 204 and one or more mounting fasteners 206. In embodiments, the haptic display device 102 may include one or more fastener receiving holes 208 configured to be aligned with one or more fastener receiving holes 210 of the housing 108. For example, the one or more fastener receiving holes 208, 210 may be configured to receive a portion of the one or more flexible mounting members 206 and a portion of the one or more mounting fasteners. In embodiments, the one or more flexible mounting members 206 may be formed of any flexible material including, but not limited to, rubber, or the like. It is noted that the mounting assembly may be configured to provide the haptic display device 102 with sufficient freedom to actuate (e.g., vibrate) when its actuation layer (see below) actuates to generate haptic feedback.

Figure 3:
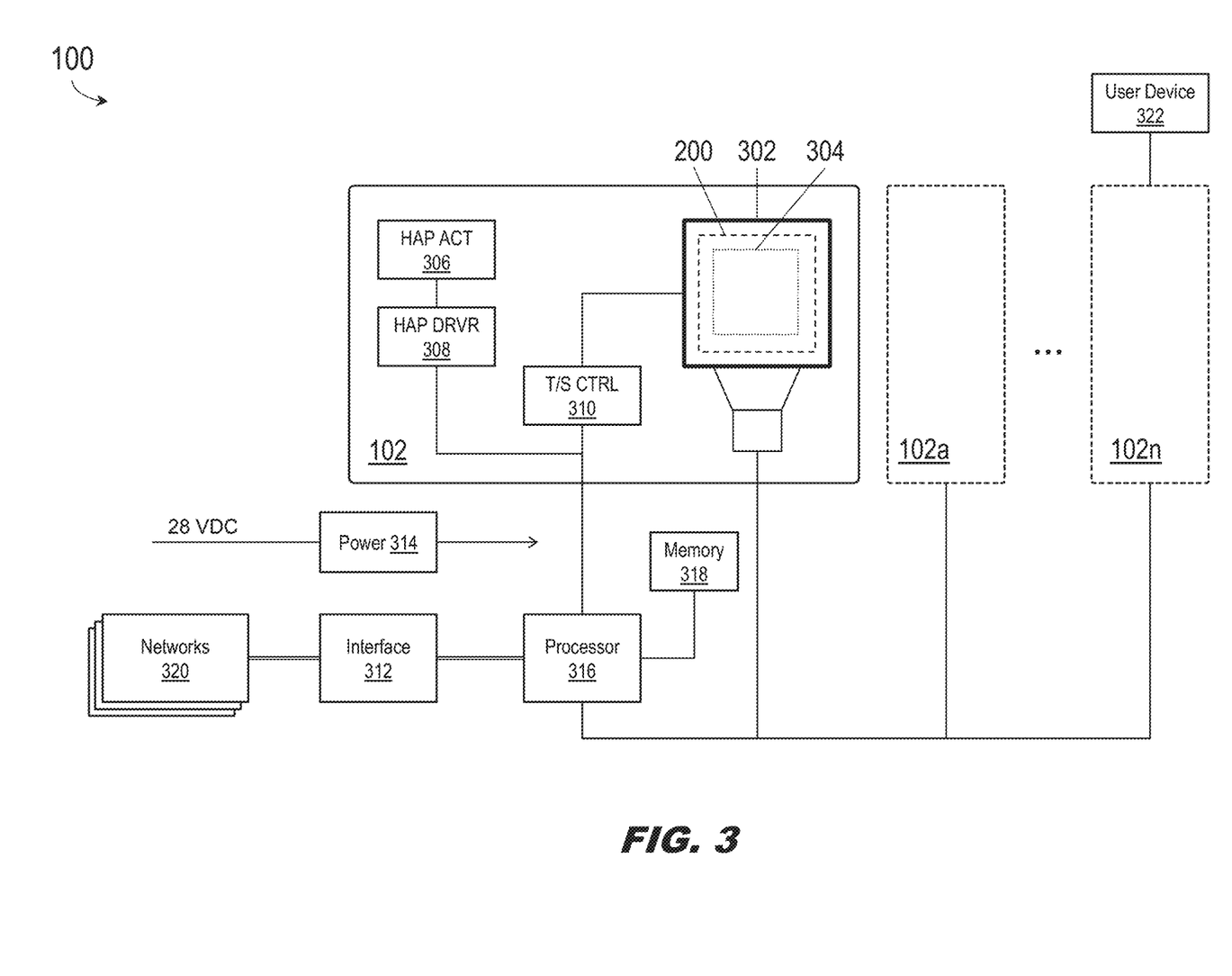
FIG. 3 is a block diagram of the cabin control module of FIG. 1.

Referring now to FIG. 3, a schematic diagram of the cabin control module 100 is shown. The cabin control module 100 may include, but is not limited to: one or more haptic display devices 102, 102a-102n (each haptic display device having a touchscreen surface 200, display bezel 302, actuation layer 304, haptic actuators 306, haptic motor drivers 308, and touch sensor controllers 310); physical (PHY) network interface 312, power supply 314, processor 316, and memory 318.

In embodiments, the network interface 312 may include, but is not limited to, an Ethernet port. For example, the cabin control module 100 may receive control signals via one or more avionics networks 320 via Ethernet twisted pair, fiber optic link, or other physical network links coupled to the network interface 312. In some embodiments, the network interface 312 may include a TJA1102 (8×8) dual port Ethernet Physical Layer (PHY) configured to receive data from dual twisted pair cables, said twisted pair cables transmitting according to 100Base-T1 standards. In some embodiments, the network interface 312 may include other physical connectors, e.g., RS-485 or other serial connectors, controller area network (CAN) bus or other digital buses, or wireless connections.

In embodiments, the power supply 314 may include any power supply known in the art, e.g., a local power supply that provides conditioned power suitable for implementation in the context of avionics (e.g., 28 VDC) capable of meeting the requirements of the cabin control module 100 and/or haptic display devices 102. In embodiments, the processor 316 may include any processors known in the art (e.g., an iMX-RT series processor). In embodiments, the memory 318 may include any memory known in the art, e.g., NOR or other like flash memory.

In embodiments, the haptic actuator/s 306 (e.g., linear resonant actuators (LRA), eccentric rotating mass (ERM), piezoelectric, or any other like haptic actuators), haptic motor drivers 308 (e.g., DRV2604 or any other haptic motor drivers) and touch sensor controllers 310 (e.g., Cypress CY8CMBR3xxx series semiconductors) may detect user contact with the touch-sensitive surface of the touchscreen surface 200 of the corresponding haptic display device 102, 102a-102n. For example, in response to user contact, the processor 316 may (e.g., via two-wire inter-integrated circuit ($I^2C$) buses, four-wire serial peripheral interface (SPI) buses, or any other appropriate buses) send appropriate control signals to the avionics networks 320 via the network interface 312; depending on the current operational mode or function assigned to the touchscreen surface 200 and/or haptic display device 102, 102a-102n, the control signals may activate or deactivate a cabin light; increase or decrease a volume level (e.g., provided via a co-located auxiliary jack module (FIG. 1, 106)); call a cabin crewmember or flight attendant; or place an order for a refreshment or product to be delivered to the user (as explained in greater detail below). In some embodiments, control signals may originate from a user device 322 (e.g., a mobile communications or computing device carried by the user) configured with one or more executable applications configured for communicating with the cabin control module 100. For example, the network interface 312 may include a wireless network interface or receiver, or the user device 322 may directly connect to the auxiliary jack module 106 (or via USB, HDMI, or other physical ports as described below). Similarly, in embodiments the cabin control module 100 may receive control signals via the avionics networks 320 and accordingly adjust graphics or images displayed by the touchscreen surfaces 200 based on the cabin systems or services currently controllable via each haptic display device 102, 102a-102n (e.g., changing the haptic display devices from a first operating mode to a second operating mode, displaying messages or alerts for the user).

Passengers expect that when they engage with a button or switch within the aircraft cabin, there is immediate feedback indicating the button or switch has been triggered, such as a click or other indication of mechanical movement. With a touch panel system, there may be no obvious tactile feedback that an action has been initiated. As such, it would be desirable to provide a system for an aircraft cabin configured to provide dynamic feedback to the passenger in response to engagement with the cabin control system.

In embodiments, each haptic display device 102, 102a-102n may include a display touchscreen 200 configured to output an image to a user (e.g., display one or more passenger control icons, photographs, and/or text identifiers as discussed below). For example, each display touchscreen 200 may include any type of display known in the art including, but not limited to, a liquid crystal display (LCD), a light emitting diode (LED) display, a plasma display panel (PDP), an electroluminescent panel, an organic light-emitting diode (OLED) display, a quantum dot light-emitting diode (QLED) display, or the like.

Figure 4A:
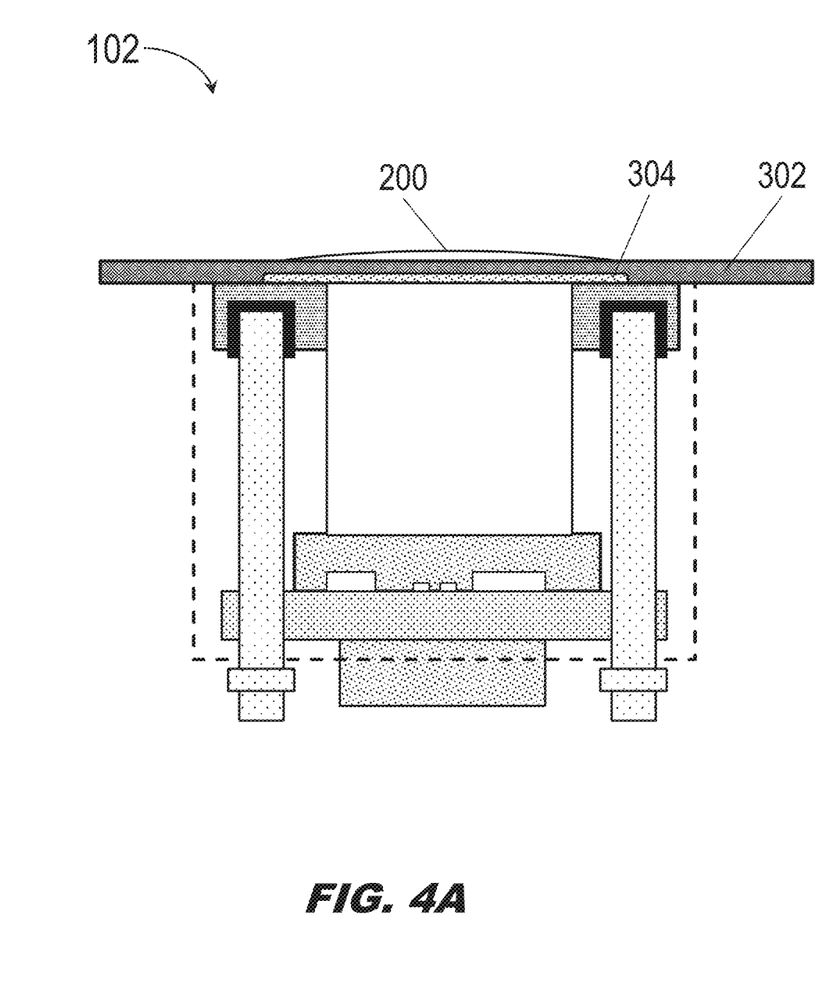
FIGS. 4A and 4B are forward and profile views of a haptic display device of the cabin control module of FIG. 1.
Figure 4B:
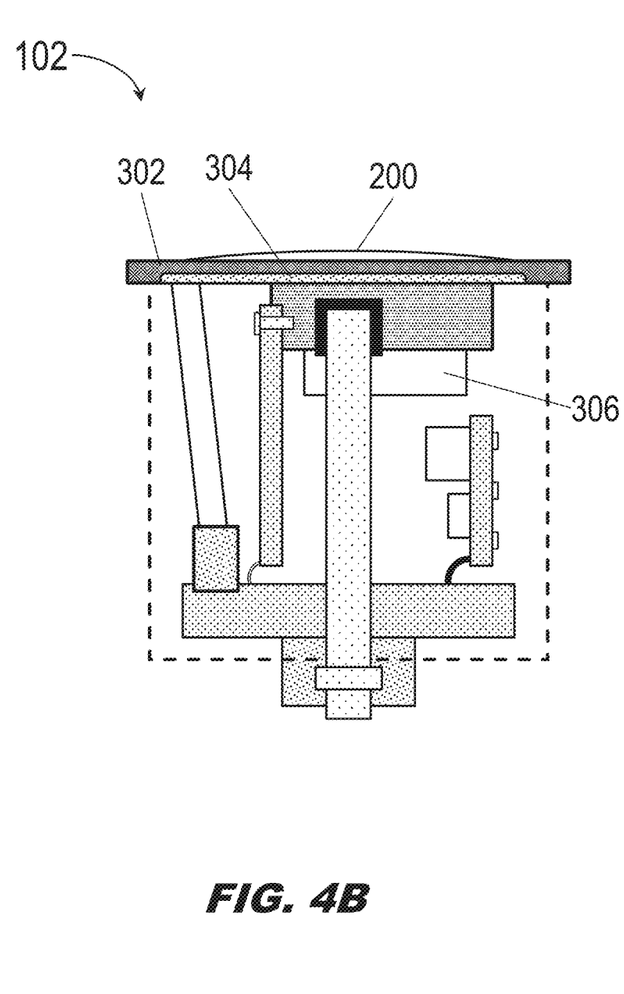

In embodiments, referring also to FIGS. 4A and 4B, each haptic display device 102 may include a display bezel 302. For example, the display bezel 202 may be positioned proximate to the display touchscreen 200. Alternatively, the display bezel 202 may fully or partially surround an edge of the display touchscreen 200. In some embodiments, the display bezel 202 may be positioned on top of the display touchscreen 200. Further, the display bezel 202 may at least partially enclose (e.g., cover a portion of a side) of the display touchscreen 200.

In embodiments, each display touchscreen 200 may include one or more touchscreen sensors (not shown) configured to sense a touch or near touch (such as a finger or apparatus (e.g., a stylus or glove) in proximity to a user-interactive surface of the haptic display device 102) of the haptic display device. For example, where the haptic display device 102 is a capacitive touchscreen display device, the one or more touchscreen sensors may include a transparent conductor layer (such as indium tin oxide (ITO)) deposited on an insulator substrate (such as glass), which results in a measurable change in capacitance when the surface of the one or more touchscreen sensors is touched or nearly touched. By way of another example, where the haptic display device 102 is a beam interrupt touchscreen display device, the one or more touchscreen sensors may include an array (e.g., an X-Y grid) of pairs of beam emitters (e.g., light emitting diodes (LEDs)) and sensors (e.g., photodetectors) configured to detect a disruption of a beam or beam pattern during the occurrence of a touch or near touch of the haptic display device. In embodiments, the one or more touchscreen sensors may be configured to output data (e.g., touch location information as signals or a change in electrical properties) to a controller, processor 316, or other computing device.

In embodiments, the display touchscreen 200 may be configured to be flexible. For example, the display touchscreen 200 may be configured to form one or more buttons (e.g., hard keys), one or more keys, or the like. In some embodiments, the display touchscreen 200 may be configured as a flexible and/or malleable LCD display that allows a force from the underside (e.g., nonviewing side) of the display touchscreen to raise a portion of the display touchscreen relative to the viewing plane of the display. Once formed, the button, key, or the like may be engaged by the user. For example, the user may push on the button, which results in a decreased height of the button (e.g., decrease the height of the protrusion) and signal to circuitry within the haptic display device 102 that the button has been pushed. In embodiments, the pressing of the button (or key, or the like) may result in a corresponding change in the cabin system or service to which the haptic display device 102 is currently coupled. For example, if the haptic display device 102 is currently configured as a lighting control button, pressing the button may then result in a light being turned on/off.

In embodiments, the haptic display device 102 may include an actuation layer 304 (e.g., haptic feedback layer) positioned proximate to (e.g., below) the display bezel 302. For example, the actuation layer 304 may be configured to generate haptic feedback in response to a user engagement with the display touchscreen 200. In embodiments, the actuation layer 304 may be configured to actuate a portion of the display touchscreen 200 to simulate the mechanical movement of a button, key, toggle, or the like.

In embodiments, the actuation layer 304 may include, or may be operatively coupled to, any type of haptic feedback actuators 306 (e.g., one or more). For example, the actuation layer 204 may include an electrical component configured to translate electrical energy into mechanical movement. Further, the haptic feedback actuators 306 may be in contact with the display touchscreen 200 in order to transmit the vibration through to the user. For example, the actuation layer 304 may include one or more linear resonant actuators (LRAs). By way of another example, the actuation layer 304 may include one or more eccentric rotating mass actuators. By way of another example, the actuation layer 304 may include one or more piezoelectric actuators.

In embodiments, the haptic display device 102 may be mountable within a cavity of the housing (202, FIG. 2B) via a mounting assembly, as shown above by FIG. 2B. For example, the mounting assembly may be configured to provide the haptic display device 102 with sufficient freedom to actuate (e.g., vibrate) within the haptic display device 102 when the actuation layer 304 generates haptic feedback. In various embodiments, the haptic display device 102 may include one or more other components such as, but not limited to, a cover transparent substrate, light control films, polarizing films, a gap, a diffuser, a housing, communicative coupling elements (e.g., wires, cables, connectors, etc.), connectivity ports, a power supply, a processor 316, a circuit board (e.g., printed circuit board (PCB)), a controller, memory 318, storage, an antenna, electro-magnetic filtering components, network connectivity devices, temperature monitoring devices, or the like. Some or all of the components of the haptic display device 102 may be communicatively coupled (e.g., via the cabin control module 100).

Figure 5A:
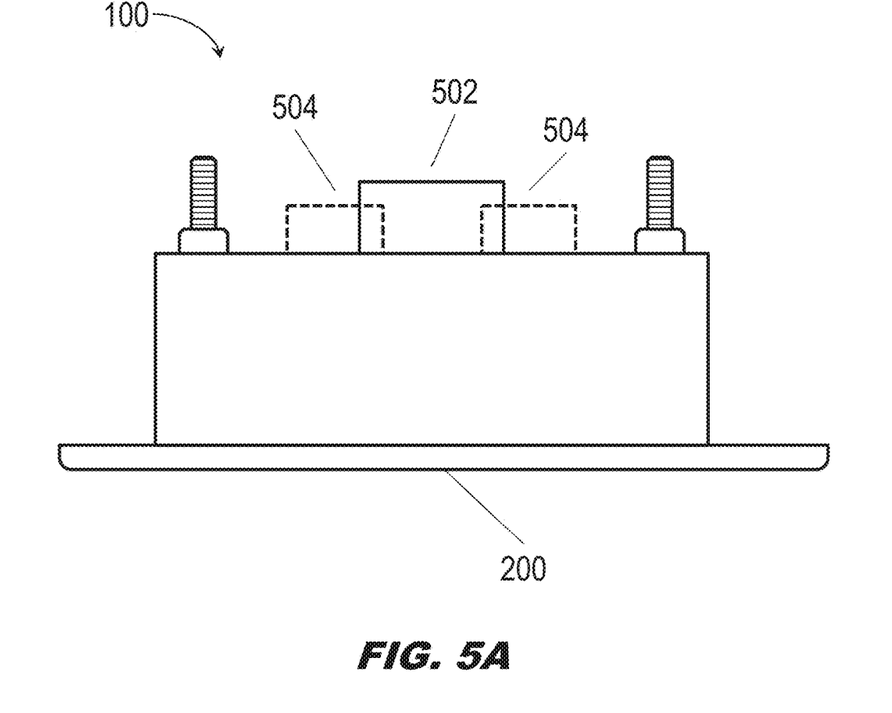
FIG. 5A is an illustration of the cabin control module of FIG. 1 in a profile view.
Figure 5B:
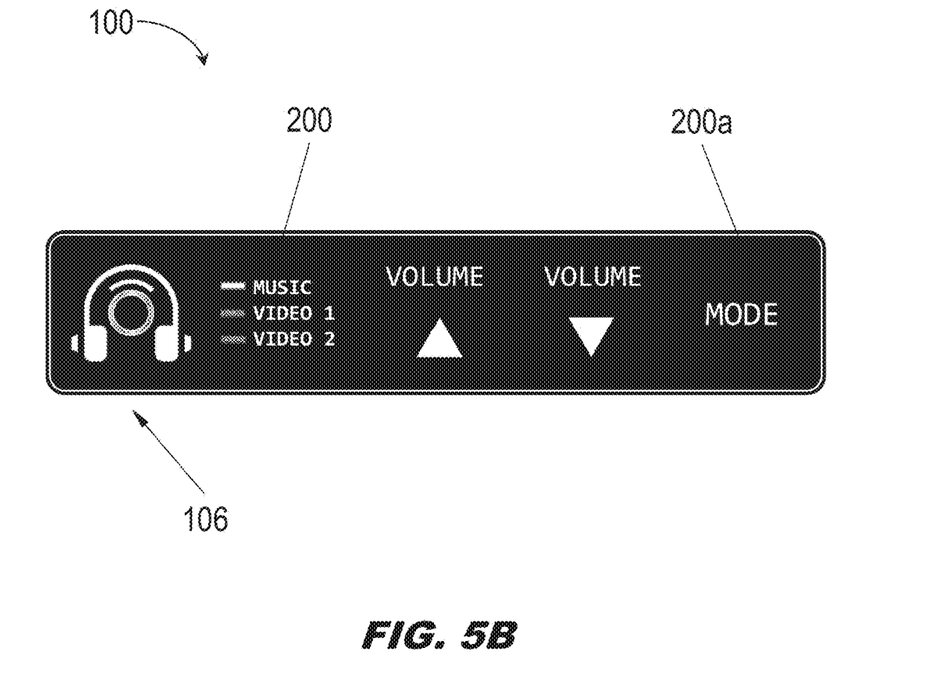
FIG. 5B is an illustration of the cabin control module of FIG. 1 in an overhead view.

Referring now to FIGS. 5A and 5B, the cabin control module 100 is shown in profile and overhead views respectively.

In embodiments, referring in particular to FIG. 5A, the cabin control module 100 may include one or more connectors 502 opposite the display touchscreens 200. For example, the cabin control module 100 may include a single 10-pin connector (or, e.g., multiple 9-pin connectors 504) compatible with a connector interface within the cabin surface into which the cabin control module is installed, the connector interface configured for two-way compatibility with one or more cabin systems of the aircraft or vehicle via the avionics networks (320, FIG. 3).

In embodiments, referring in particular to FIG. 5B, the display touchscreens 200 (e.g., of each haptic display device (102, FIG. 1)) may collectively display coordinated images or graphic elements according to an operating mode. For example, the cabin control module 100 may be configured for several context-dependent operating modes, transitioning between operating modes based on control signals received via the avionics networks 320 or when manually transitioned by the user. For example, as shown by FIG. 4A, the cabin control module 100 may include an in-flight entertainment (IFE) operating mode, e.g., for use with onboard audio or video systems. In some embodiments, the cabin control module 100 may automatically engage the IFE operating mode when a plug is detected in the audio jack 106.

In some embodiments, a particular operating mode of the cabin control module 100 may include a display touchscreen 200a (and/or corresponding haptic display device 102) dedicated to toggling the cabin control module 100 between or among multiple operating mode. For example, while the cabin control module 100 shown by FIG. 5A may be currently set to an IFE operating mode, a passenger or user may engage the display touchscreen 200a to toggle the cabin control module to a different operating mode, e.g., for control of seating configuration, cabin lighting, and/or calling cabin crew. Further, repeated engagement of the new operating mode display touchscreen 200a may toggle the cabin control module 100 through a repeating cycle of operating modes (e.g., IFE 4 reading lights 4 call button 4 refreshment orders).

Figure 5C:
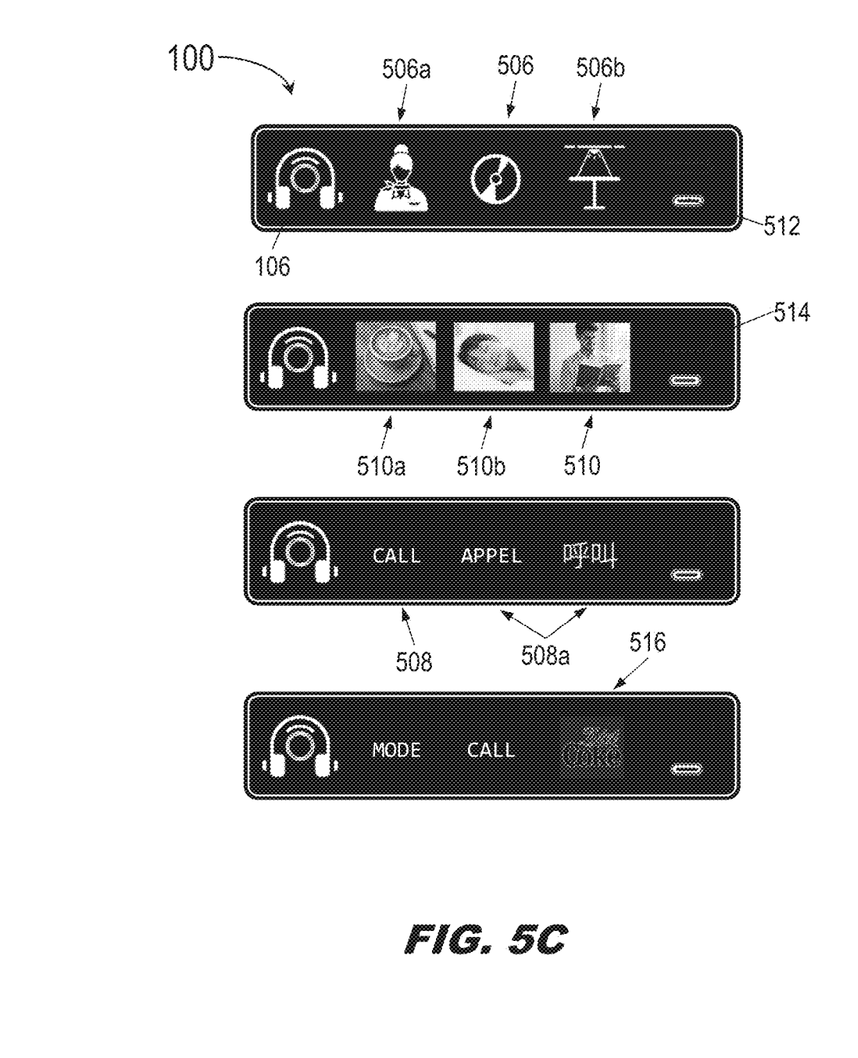
FIG. 5C is an overhead view of the cabin control module of FIG. 1 in various operating modes.

Referring also to FIG. 5C, the cabin control module 100 is shown in various operating modes. In embodiments, the display touchscreens 200 and haptic display devices 102 of each cabin control module 100 may selectively be configured for display to the passenger or user of additional visual information, either as a default setting or in response to user engagement with one of more of the display touchscreens.

In embodiments, each display touchscreen 200 may be configured to display one or more icons 506 (e.g., graphical elements) configured to indicate to the user the current cabin system or function controllable by each display touchscreen 200 and haptic display device 102. For example, each display touchscreen 200 may be configured to display any type of icon including, but not limited to, a call icon 506a, a table light icon 506b, a reading light icon, a light icon, a volume icon (e.g., increase volume/decrease volume), a select icon, a directional icon (e.g., right, left, up, and/or down), a play icon, a pause icon, a fast forward icon, a rewind icon, or the like.

In some embodiments, the display touchscreens 200 may be selectively configured for display of like visual information either as icons 506, as textual identifiers 508, or as photographic identifiers 510. For example, icons 506 may be branded per user preferences and may be customized in real time to adjust the brightness, foreground color, and/or background color of each icon or set thereof. Similarly, photographic identifiers 510 may be customized for user preferences to indicate display touchscreens for ordering refreshments 510a, do not disturb 510b, and other specific cabin systems or functions. In some embodiments, the display touchscreens may be customized to display menus of textual identifiers 508 in multiple languages 508a.

In some embodiments, in addition to or instead of the audio jack 106, the cabin control module 100 may include USB-C ports 512 (e.g., and/or other data communications ports) and/or HDMI ports 514. For example, a user may connect a user device (322, FIG. 4) to the USB-C port 512 to charge the user device via an aircraft power system (314, FIG. 3) or interact with IFE systems by connecting the user device to the HDMI port 514.

In some embodiments, the cabin control module 100 may receive (e.g., via the avionics networks (316, FIG. 3)) information specific to the user (e.g., to a passenger assigned to the seat proximate to the cabin control module) and may customize or personalize its operating modes accordingly. Alternatively or additionally, one or more display touchscreens 200 may be configured to display sponsored and/or branded content 516. For example, a passenger database may indicate that a particular user tends to order or consume a particular refreshment, or a particular brand of food or beverage (e.g., Diet Coke). Accordingly, when this user is assigned a seat, the cabin control module 100 proximate to that seat may display (e.g., when in refreshment/order mode) a display touchscreen 200 enabling the user to order a Diet Coke (516) via engagement with the display touchscreen.

In some embodiments, the cabin control module 100 may display operating modes and other content based on avionics information provided by aircraft networks (320, FIG. 3). For example, the cabin control module 100 may provide additional operating modes or change default settings based on the current time of day, the current flight segment, or the current position of the aircraft, e.g., discontinuing refreshment menus and displaying fasten-seat-belt signage during descent and landing phases, or changing refreshment menus displayed by the display touchscreens 200 as appropriate for morning, afternoon, or evening.

Figure 5D:
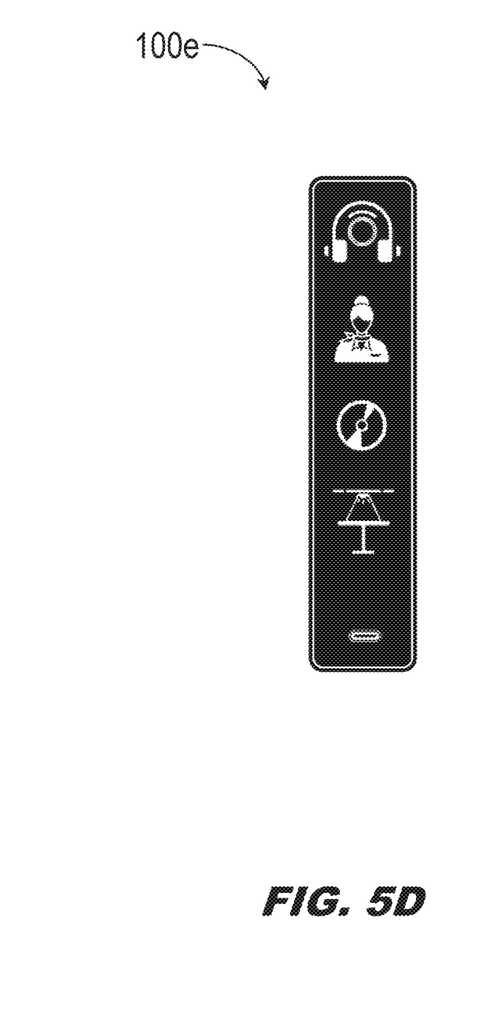
FIG. 5D is an overhead view of the cabin control module of FIG. 1 in a vertical orientation.

Referring also to FIG. 5D, the cabin control module 100e may be implemented and may function identically to the cabin control modules 100, 100a-100d shown by FIGS. 1 through 5B, except that the cabin control module 100e may be installed in a cabin surface in a vertical rather than horizontal orientation. Accordingly, the display touchscreens 200 and haptic display devices (300, FIG. 3) of the cabin control module 100e may be programmed for display in a vertical orientation conformal to the orientation of the cabin control module.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:
1. A cabin control apparatus, comprising:
a housing at least partially mountable within a cabin surface of a vehicle, the cabin surface in or proximate to a seat assigned to a passenger of the vehicle; and
one or more haptic display devices disposed within the housing, each haptic display device operatively coupled to at least one cabin system of the vehicle via a physical network connection and at least one vehicle network, each haptic display device comprising:
a touch-sensitive display surface configured:
to receive control input via engagement by the passenger; and
to display system status information to the passenger, the system status information indicative of at least one of 1) an identifier of the current cabin system to be controlled by the control input or 2) a status of the current cabin system, the current cabin system based on operating context received from the at least one vehicle network;
a display bezel disposed proximate to the touch-sensitive display surface; and
an actuation layer disposed proximate to the display bezel and comprising one or more actuators configured to provide haptic feedback to the passenger in response to the engagement;
wherein the current cabin system is selected from a group including:
an inflight entertainment (IFE) system;
a cabin light associated with the passenger; or
a call system configured for notifying a crewmember of the vehicle.

2. The cabin control apparatus of claim 1, wherein:
the one or more haptic display devices are collectively associated with one or more operating modes; and
each operating mode is associated with one or more cabin systems controllable by the one or more haptic display devices when the operating mode is active.

3. The cabin control apparatus of claim 2, wherein the one or more haptic display devices include at least one first touchscreen surface configured to toggle the cabin control module from a first operating mode to a second operating mode.

4. The cabin control apparatus of claim 1, wherein the one or more haptic display devices include at least one first haptic display device comprising at least one physical port configured for receiving an auxiliary connector coupled to a remote user device, the at least one physical port including at least one of:
an audio jack;
a USB port;
or
an HDMI port.

5. The cabin control apparatus of claim 4, wherein:
the first haptic display device is configured to receive control input associated with an in-flight entertainment (IFE) system in response to an engagement of the auxiliary connector with the audio jack or the HDMI port.

6. The cabin control apparatus of claim 5, wherein the remaining one or more haptic display devices are configured for at least one of:
a volume control;
a channel selection;
or
an IFE control.

7. The cabin control apparatus of claim 4, wherein:
the first haptic display device is configured to receive the control input via the remote user device.

8. The cabin control apparatus of claim 4, wherein:
the at least one vehicle network includes a power supply of the vehicle; and
the physical port is configured to recharge the remote user device via the auxiliary connector.

9. The cabin control apparatus of claim 1, wherein the operating context includes information specific to the passenger.

10. The cabin control apparatus of claim 1, wherein:
the operating context is based on vehicular information provided by the at least one vehicle network, the vehicular information including at least one of a time of day, a current trip segment, or a position of the vehicle.

11. The cabin control apparatus of claim 1, wherein the identifier of the current cabin system to be controlled by the control input includes at least one of:
at least one graphical element on a background;
a photographic image;
or
a text identifier.

12. The cabin control apparatus of claim 1, wherein the one or more actuators include at least one of:
a linear resonant actuator;
an eccentric rotating mass actuator;
or
a piezoelectric actuator.

13. The cabin control apparatus of claim 1, wherein the one or more actuators are configured to provide haptic feedback in response to the engagement by actuating a portion of the touch-sensitive display surface to simulate a mechanical movement.

\* \* \* \* \*